United States Patent [19]
Porter et al.

[11] Patent Number: 5,679,168
[45] Date of Patent: *Oct. 21, 1997

[54] THERMAL PROCESSING APPARATUS AND PROCESS

[75] Inventors: Cole D. Porter; Jessie R. Sanchez, both of San Jose; Jeffrey M. Kowalski, Dove Canyon, all of Calif.

[73] Assignee: Silicon Valley Group, Inc., San Jose, Calif.

[*] Notice: The term of this patent shall not extend beyond the expiration date of Pat. No. 5,626,680.

[21] Appl. No.: 565,177

[22] Filed: Nov. 28, 1995

Related U.S. Application Data

[63] Continuation-in-part of Ser. No. 399,108, Mar. 3, 1995, Pat. No. 5,626,680.

[51] Int. Cl.$^6$ .................................................. C23C 16/00
[52] U.S. Cl. .................. 118/725; 118/715; 118/728; 118/729; 156/345; 432/253; 432/258; 432/5; 432/6
[58] Field of Search .................................. 118/715, 725, 118/728, 729; 156/345; 432/253, 258, 5, 6

[56] References Cited

U.S. PATENT DOCUMENTS

| | | | |
|---|---|---|---|
| 5,320,680 | 6/1994 | Learn et al. | 118/724 |
| 5,443,649 | 8/1995 | Sibley | 118/728 |
| 5,482,558 | 1/1996 | Watanabe | 118/728 |

FOREIGN PATENT DOCUMENTS

| | | |
|---|---|---|
| 4-184923 | 7/1992 | Japan . |
| 5-06894 | 1/1993 | Japan . |

*Primary Examiner*—Richard Bueker
*Attorney, Agent, or Firm*—William B. Walker

[57] ABSTRACT

A thermal treatment boat having a plurality of annular, coaxial, spaced apart bands having substantially the same inner diameters. The bands are separated by a band spacing distance of from about 3.8 to 12.7 mm, each of the bands having a height, Height$_{Band}$, in mm according to the equation:

$$Height_{Band} = \frac{ColumnHeight - \Sigma BandSpacing}{NumberBands}$$

wherein Height$_{Band}$ is always ≥ wafer thickness; ColumnHeight is the total height of the treatment boat, mm; BandSpacing is the band spacing distance between adjacent bands, mm; and NumberBands is the total number of bands in the treatment boat. Preferably the NumberBands is from about 12 to about 100. Each band includes wafer support means for supporting a wafer therein at a position which is substantially centered between the upper edge surface and said lower edge surface thereof, the wafer support means in one embodiment including at least three inwardly extending projections. Each band is sized to provide a radial clearance between the outer edge of the wafer and the inner surface of the respective band within the range of from about 1.5 to 6.3 mm. In the process, the heat provided by the heater is sufficient to raise the temperature of the wafers from 21° C. up to 1100° C. at a rate of from 50° C./min to 100° C./min without causing mechanical damage due to induced stresses in the wafers.

16 Claims, 8 Drawing Sheets

5,679,168

THERMAL PROCESSING APPARATUS AND PROCESS

RELATIONSHIP TO COPENDING APPLICATION

This application is a continuation-in-part of application Ser. No. 08/399,108, Mar. 3, 1995, now U.S. Pat. No. 5,626,680.

FIELD OF THE INVENTION

This invention relates to an improved thermal processing apparatus and process for heat treatment of semiconductor and glass wafer substrate and the like.

BACKGROUND OF THE INVENTION

Heat treatment devices have been used to form diffusion layers or form silicon oxide or nitride films in the manufacture of electronic devices on semiconductor or glass substrates. These substrates are typically thin wafers made of silicon or other semiconductor, and the description of the device hereinafter will be provided in reference to wafer substrates, it being understood that the apparatus is equally suitable for treating any thin glass or semiconductor sheets, and treatment of all of these materials are considered to be within the scope of this invention.

These devices provide the desired heat treatment by heating the wafers in a reactor or heating chamber while introducing inert or reactive gases into the chamber. These heating chambers are surrounded by heating elements enclosed within an insulated shell. In order to treat large numbers of wafers in a single heat treatment operation, it is conventional to support the wafers, one above the other in a parallel orientation, in a wafer boat. This combination is referred to hereinafter as a wafer stack.

The heat treatment apparatus and process must accomplish the heat treatment without damaging the wafers such as by causing slips or warping, for example. Therefore, severe temperature differences across the width of the substrates must be avoided. On the other hand, the heating process should be as brief as necessary to accomplish the desired treatment.

The transfer temperature of the wafers to and from the furnace or reactor is from 500° to 600° C. The heating cycle is initiated after the wafer stack, at the transfer temperature, is positioned in the heating chamber, and ambient gases have been replaced by suitable protective gases. The usual wafer spacing in the wafer stack is approximately 4 mm per wafer. Heat radiating from the heating elements surrounding the heating chamber impinge primarily on the outer edges of the wafers. Increasing the heating and cooling rates causes an increase in temperature differences between the outer edge and center of the wafers, and an excessive increase in heating and cooling rates causes thermal distortions, leading to warping, crystal defects and slips in the wafers. The maximum heating rate in such configurations is limited to 10°–12° C./min, and the maximum cooling rate is about 5° C./min. This extends the time of each thermal treatment cycle and severely limits the production capacity or throughput of each thermal treatment device.

Japanese patent application publication Hei 4-184923 to Nishimura et al. (Jul. 1, 1992) describes a heat treatment apparatus designed to reduce the heating time. In this apparatus, the wafers are supported in a circular jig having a heat capacity graduated to be maximum at the periphery of the wafers. The jigs comprise ring-shaped trays which hold the wafers around their peripheries, the thickness of the heat capacity of the tray being constant or increasing from the inside to the outside. The trays can be formed from several materials in which the specific heat is greater on the outside than the inside. The Nishimura et al. system greatly increases the heat capacity of the components in the heating chamber, requiring the provision of greater heat energy for the heating phase and greater heat removal during the cooling phase of the cycle. The minimum times of both the heating and cooling phases are extended by these high heat capacity components.

OBJECTS AND SUMMARY OF THE INVENTION

It is an object of this invention to provide a rapid heating and cooling thermal treatment apparatus and process with heating rates of from 50° to 100° C./min and cooling rates up to 50° C./min.

It is another object of this invention to provide a thermal treatment apparatus and method which greatly reduces the temperature differences across the width and surfaces of a stack of wafers being processed, thereby greatly reducing or eliminating mechanical damage due to induced stresses in the wafers.

In summary, the thermal treatment boat of this invention comprises a plurality of annular, coaxial, spaced apart bands having substantially the same inner diameters. Each band has an upper edge surface and a lower edge surface. The lower edge surface of the upper band of each set of adjacent bands is opposed to the upper edge surface of the lower band of each set and is spaced therefrom by a band spacing distance of from about 3.8 to 12.7 mm. Each of the bands has a height, $Height_{Band}$, in mm according to the equation:

$$Height_{Band} = \frac{ColumnHeight - \Sigma BandSpacing}{NumberBands}$$

wherein $Height_{Band}$ is always $\geq$ wafer thickness; ColumnHeight is the total height of the treatment boat in mm; BandSpacing is the band spacing distance between adjacent bands, mm; and NumberBands is the total number of bands in the treatment boat.

Preferably the NumberBands is from about 12 to about 100, provided that $Height_{Band}$ is at least $\geq$ the wafer thickness.

Preferably, each band includes wafer support means for supporting a wafer therein at a position which is substantially centered between the upper edge surface and said lower edge surface thereof, the wafer support means in one embodiment including at least three inwardly extending projections. Each band can have an inner surface, and each band and wafer support means can define a wafer occupancy zone corresponding to the volume to be occupied by a wafer for which it is sized. The radial clearance between the outer edge of the wafer occupancy zone and the inner surface of the respective band is within the range of from about 1.5 to 6.3 mm.

In one embodiment, each band and wafer support means defines a wafer occupancy zone corresponding to the volume to be occupied by a wafer for which it is sized. The outer diameter of the wafer occupancy zone is about 150 mm, and the NumberBands is from about 25 to 100. In another embodiment, the outer diameter of the wafer occupancy zone is about 200 mm, and the NumberBands is from about 25 to 75. In a still further embodiment, the wafer occupancy zone is about 300 mm, and the NumberBands is from about 12 to 48.

In one embodiment, each band is an incomplete circle, the opposed ends thereof defining a slot having a width of from 5 to 20 mm. Optimally, it can include a slot shield element, laterally displaced from said slot and overlapping the slot, whereby to reduce radiant heat impinging on the slot.

The thermal treatment boat of this invention can have components made of metal, crystal, ceramic, graphite or composite. Compounds such as quartz, polysilicon, silicon carbide, alumina or silica are preferred. Quartz forms with different opacities such as sandblasted, opaque and clear fused quartz can be used. The heat shield material must have dimensional and structural stability at the maximum heat treatment temperatures, the purity and inertness to prevent contamination of the materials being processed, and the opacity to shield the wafer surface from a portion of the infrared radiant heat emitted by the heat sources surrounding the wafer boat.

In a preferred embodiment, the height of each band and the band spacing between adjacent bands are substantially the same, and the bands are supported in a unitary or preferably one-piece assembly by axially extending rods or plates to which the bands are attached.

In summary, the process of this invention for heat treating multiple wafers positioned in a mutually parallel orientation in a heating zone surrounded by a heater emitting radiant heat comprises shielding the outer portions of each wafer from radiant heat emitted by the heater with a annular heat band positioned between the outer edge of each wafer and the heater. Each annular heat band is one of a plurality of coaxial, spaced apart heat bands having substantially the same inner diameters. Each band has an upper edge surface and a lower edge surface, the lower edge surface of the upper band of each set of adjacent bands being opposed to the upper edge surface of the lower band of each set and being spaced therefrom by a band spacing distance of from about 3.8 to 12.7 mm. Each of the bands has a height, $Height_{Band}$, in mm according to the equation:

$$Height_{Band} = \frac{ColumnHeight - \Sigma BandSpacing}{NumberBands}$$

wherein $Height_{Band}$ is always $\geq$ wafer thickness; ColumnHeight is the total height of the treatment boat, mm; BandSpacing is the band spacing distance between adjacent bands, mm; and NumberBands is the total number of bands in the treatment boat.

Preferably, the distance between the edge of each wafer and the band by which it is shielded is from 1.5 to 6.3 mm.

In a preferred embodiment of the process, the heat provided by the heater is sufficient to raise the temperature of the wafers from 21° C. up to 1100° C. at a rate of from 50° C./min to 100° C./min without causing mechanical damage due to induced stresses in the wafers.

DETAILED DESCRIPTION OF THE INVENTION

The apparatus of this invention is used for thermal treatment of thin wafers or glass substrates, primarily in the preparation of semiconductor devices for the electronics industry. This apparatus processes the wafers or substrates, supported in a position where the wafers have a common, vertical central axis and a parallel, spaced-apart orientation. The wafers are positioned in a wafer boat or similar rack to provide a greatly reduced cycle process time without causing mechanical damage due to induced stresses in the wafers.

Figure 1:
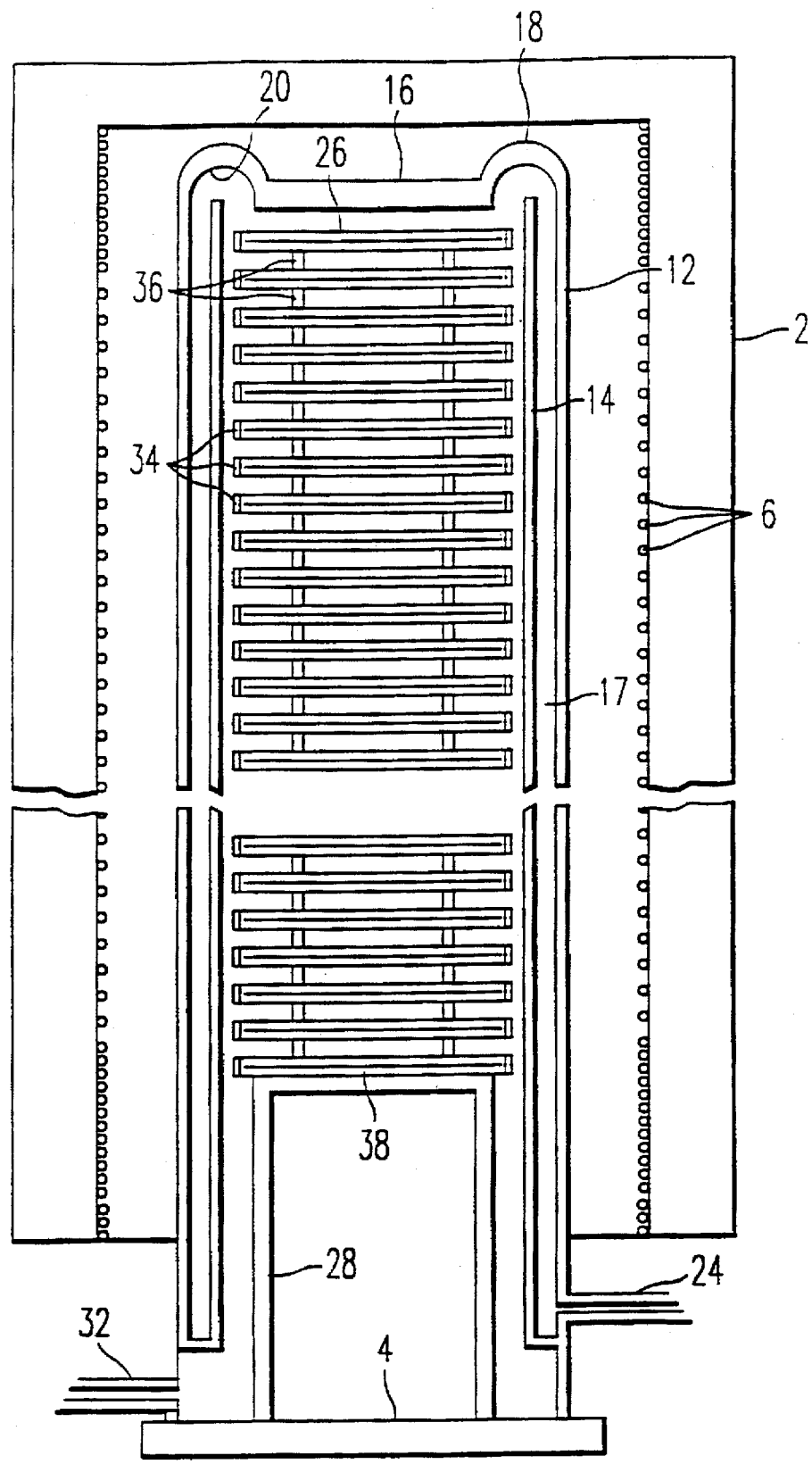
FIG. 1 is a cross-sectional schematic view of a representative thermal treatment apparatus of this invention with a wafer stack placed in the heating zone.
Figure 2:
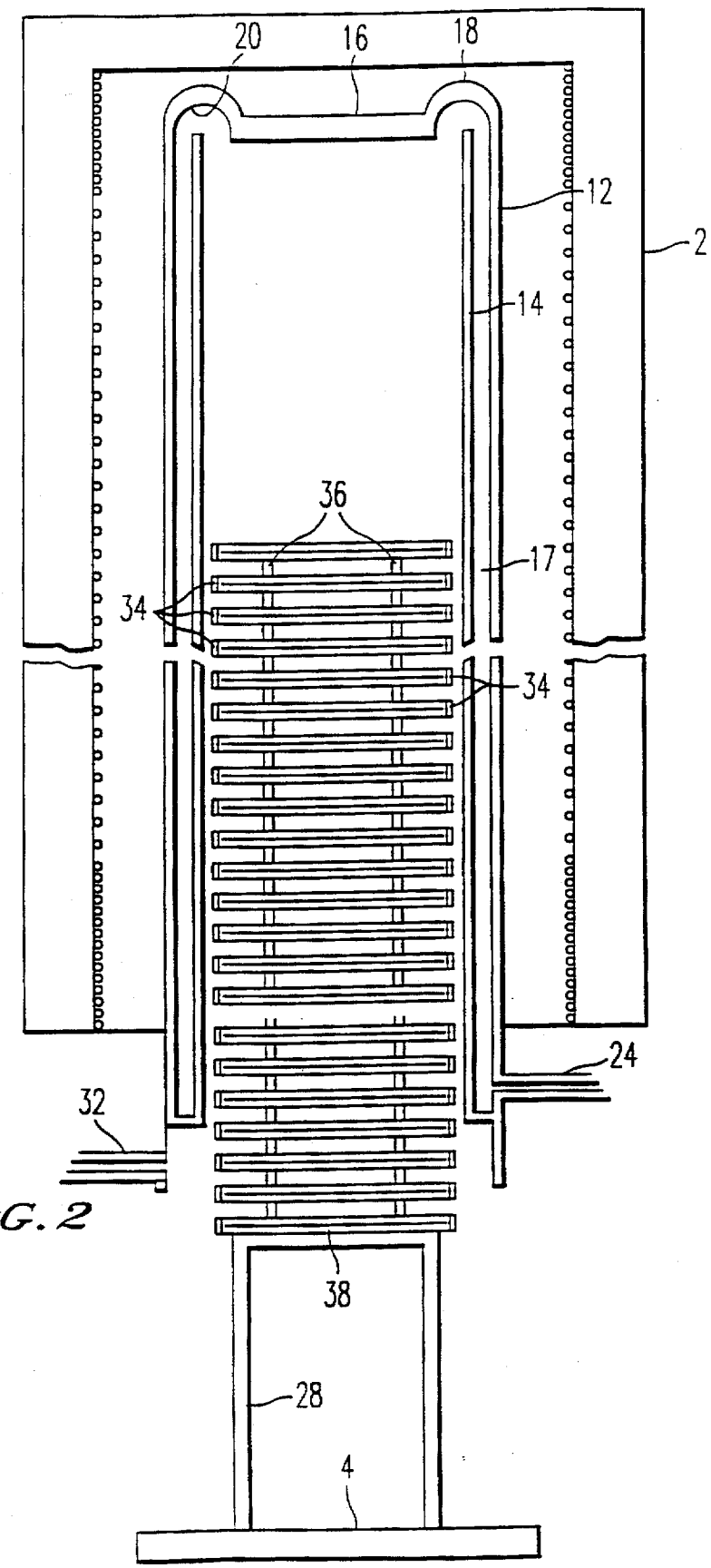
FIG. 2 is a cross-sectional schematic view of the thermal treatment apparatus shown in FIG. 1 with the wafer stack support in a partially lowered position.

FIG. 1 is a cross-sectional schematic view of a representative thermal treatment apparatus of this invention with a wafer stack placed in the heating zone, and FIG. 2 is a cross-sectional schematic view of the thermal treatment apparatus with the wafer stack support in a partially lowered position. This apparatus is a reactor or furnace having an outer insulated housing or casing 2 with an axially moveable base support platform 4. The inner surface of the reactor casing is lined with resistance heating elements 6 or equivalent heat sources distributed to provide a uniform isothermal temperature within the chamber.

The support platform 4 is raised and lowered by a conventional system such as shown in U.S. Pat. No. 5,320,680, to load the wafer boat in the furnace before heat treatment and to remove it therefrom after the treatment cycle is completed.

The gas flow through the reactor is controlled in part by the quartz cylinders or tubes 12 and 14. The space 17 between the outer cylinder 12 and the inner cylinder 14 is a preheat zone through which rising gases are passed to raise their temperature to the desired treatment temperature or higher. The upper end of the treatment chamber includes a central disk 16. The curved tube flange 18 extends from the periphery of the disk 16 to the upper end of the outer tube 12. The inner surface 20 of the tube flange 18 is preferably curved, for example in the shape of a section of a torus, to maintain laminar flow patterns of gases being directed thereby and to strengthen the support of the head disk 16 under a vacuum load.

The lower end of the assembly has a gas inlet conduit 24. The reaction heating chamber is defined by the inner cylinder 14. A wafer boat 26 supported on a pedestal 28 is positioned in the heating chamber during the treatment cycle, the inner cylinder 14 defining the gas flow passageway past the wafer boat. The lower portion of the tube assembly has a gas outlet conduit 32. The pedestal 28 can include heating elements (not shown) to reduce heat loss through the lower portion of the chamber.

The wafer boat consists of a plurality of wafer support sections 34 attached to support rods 36, positioned around the outer perimeter in a spacing permitting insertion of wafers into the sections, the rods 36 being attached to the boat base portion 38. They can also be an integral construction.

Figure 3:
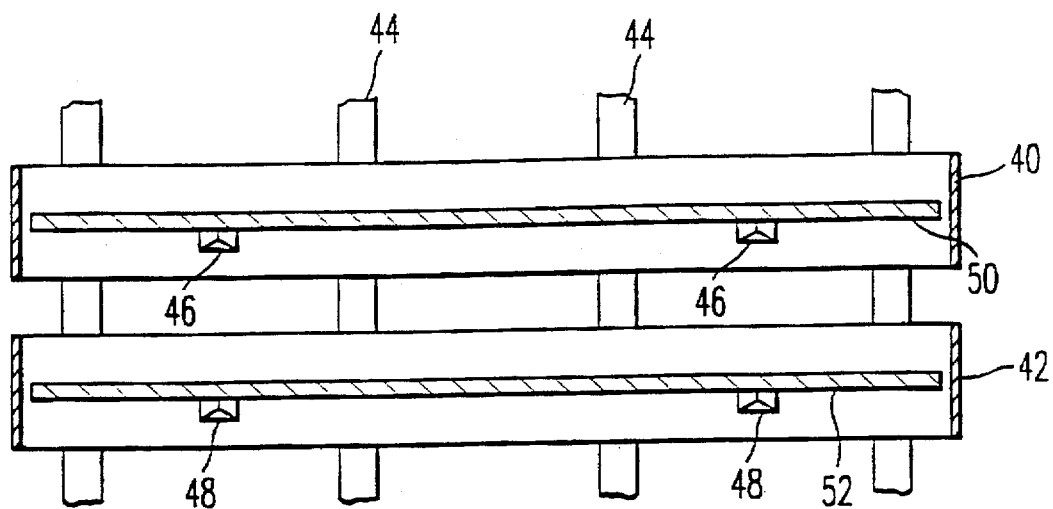
FIG. 3 is cross-sectional view of a portion of a wafer stack, showing the position of the wafers within a annular heat shield.
Figure 4:
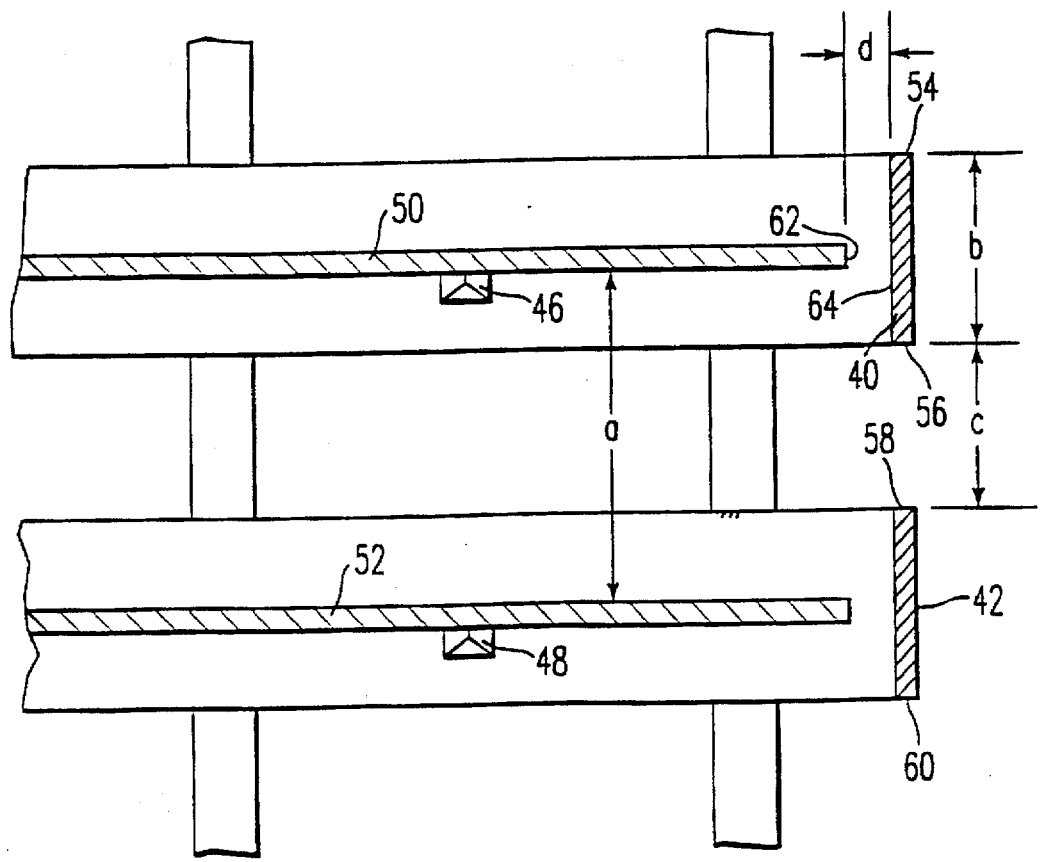
FIG. 4 is a fragmentary, enlarged cross-sectional view of a portion of a wafer stack showing the positional relationship between adjacent wafers and between the wafers and the annular heat shield.

FIG. 3 is cross-sectional view of a portion of a wafer stack, showing the position of the wafers within a annular heat shield, and FIG. 4 is a fragmentary, enlarged cross-sectional view of a portion of a wafer stack showing the positional relationship between adjacent wafers and between the wafers and the annular heat shield. The wafer stack consists of coaxial annular heat shields 40 and 42, each of which is a section of a cylinder secured to vertical support rods 44 by welding or other integral construction. Wafer support projections 46 and 48 extend from the inner wall of the respective shields 40 and 42, the upper surfaces thereof being in a plane corresponding to the bottom surface of a wafer 50 and 52 supported thereon. The distance between top surfaces of adjacent wafers (and the distance between adjacent wafer support planes) is "a".

The thermal treatment boat of this invention can have components made of metal, crystal, ceramic, graphite or composite. Compounds such as quartz, polysilicon, silicon carbide, alumina or silica are preferred. Quartz forms with different opacities such as sandblasted, opaque and clear fused quartz can be used. The heat shield material must have dimensional and structural stability at the maximum heat treatment temperatures, the purity and inertness to prevent contamination of the materials being processed, and the opacity to shield the wafer surface from a portion of the infrared radiant heat emitted by the heat sources surrounding the wafer boat.

The upper heat shields 40 has upper and lower edges 54 and 56, and the lower heat shield 42 has upper and lower edges 58 and 60. The height of each heat shield, that is the distance between its upper and lower edges, is "b".

The distance between the opposing lower edge 56 of an upper heat shield 40 and the upper edge 58 of lower heat shield 42 is "c". The outer edge 62 of each wafer 50 is spaced from the opposed inner surface 64 of the corresponding heat shield by distance "d".

The height of the heat shields and the distance between the edges of adjacent shields are critically important aspects of this invention. They establish the size and positions of the wafer surfaces which are shielded from direct exposure to the heat sources and those further areas which are shielded from the heat sources which are nearest the wafer. They thus establish a heat conduction pattern in the wafers which are from the inner wafer areas to the outer edges and center. We have discovered that with this heating pattern, temperature differences between the center and outer edges of the wafer are greatly reduced even during rapid heating, greatly reducing the cycle time required to eliminate destructive thermal damage to the wafers.

The relative dimensions of the components and spacings in the wafer boat are an important aspect of the invention. It can be seen that the treatment boat comprises a plurality of annular, coaxial, spaced apart bands having substantially the same inner diameters, each band having an upper edge surface and a lower edge surface. The lower edge surface of the upper band of each set of adjacent bands are opposed to the upper edge surface of the lower band of each set and are spaced therefrom by a band spacing distance "c" of from about 3.8 to 12.7 mm. Each of the bands has a height, $Height_{Band}$, in mm according to the equation:

$$Height_{Band} = \frac{ColumnHeight - \Sigma BandSpacing}{NumberBands}$$

wherein $Height_{Band}$ is always ≧ wafer thickness; ColumnHeight is the total height of the treatment boat in mm; BandSpacing is the band spacing distance between adjacent bands, mm; and NumberBands is the total number of bands in the treatment boat.

Preferred dimensions for three standard sizes of wafers are shown in the following Tables 1, 2, 3, 4, 5 and 6.

TABLE 1

| Family 150 mm | Min., mm | Max., mm | Min., mm | Max., mm |
|---|---|---|---|---|
| Slot Width w | 5.1 | 19.1 | 5.1 | 19.1 |
| Radial Clearance d | 1.5 | 6.4 | 1.5 | 6.4 |
| Tube Int. φ $\phi_{10} = \phi_w + 2d$ | 153.0 | 162.7 | 153.0 | 162.7 |
| Band Height b = a − c | 26.7 | 27.9 | 11.4 | 7.6 |
| Band Spacing c | 3.8 | 12.7 | 3.8 | 12.7 |
| Pitch a = l/n = (Flat zone)/(No. wafers) | 30.5 | 40.6 | 15.2 | 20.3 |
| Flat Zone l | 762 | 1016 | 762 | 1016 |
| No. of Wafers n | 25 | 25 | 50 | 50 |
| Wafer φ ($\phi_w$) | 150 | 150 | 150 | 150 |

TABLE 2

| Family 150 mm | Min., mm | Max., mm | Min., mm | Max., mm |
|---|---|---|---|---|
| Slot Width w | 5.1 | 19.1 | 5.1 | 19.1 |
| Radial Clearance d | 1.5 | 6.4 | 1.5 | 6.4 |
| Tube Int. φ $\phi_{10} = \phi_w + 2d$ | 153.0 | 162.7 | 153.0 | 162.7 |
| Band Height b = a − c | 6.4 | 0.8 | 3.8 | ≧ wafer thickness |
| Band Spacing c | 3.8 | 12.7 | 3.8 | 12.7 |
| Pitch a = l/n | 10.2 | 13.5 | 7.6 | 10.2 |
| Flat Zone l | 762 | 1016 | 762 | 1016 |

TABLE 2-continued

| Family 150 mm | Min., mm | Max., mm | Min., mm | Max., mm |
| --- | --- | --- | --- | --- |
| No. of Wafers n | 75 | 75 | 100 | 100 |
| Wafer φ ($\phi_w$) | 150 | 150 | 150 | 150 |

TABLE 3

| Family 200 mm | Min., mm | Max., mm | Min., mm | Max., mm |
| --- | --- | --- | --- | --- |
| Slot Width w | 5.1 | 19.1 | 5.1 | 19.1 |
| Radial Clearance d | 1.5 | 6.4 | 1.5 | 6.4 |
| Tube Int. φ $\phi_{10} = \phi_w + 2d$ | 203.0 | 212.7 | 203.0 | 212.7 |
| Band Height b = a − c | 26.7 | 27.9 | 11.4 | 7.6 |
| Band Spacing c | 3.8 | 12.7 | 3.8 | 12.7 |
| Pitch a = l/n | 30.5 | 40.6 | 15.2 | 20.3 |
| Flat Zone l | 762 | 1016 | 762 | 1016 |
| No. of Wafers n | 25 | 25 | 50 | 50 |
| Wafer φ ($\phi_w$) | 200 | 200 | 200 | 200 |

TABLE 4

| Family 200 mm | Min., mm | Max., mm |
| --- | --- | --- |
| Slot Width w | 5.1 | 19.1 |
| Radial Clearance d | 1.5 | 6.4 |
| Tube Int. φ $\phi_{10} = \phi_w + 2d$ | 203.0 | 212.7 |
| Band Height b = a − c | 6.4 | .8 |
| Band Spacing c | 3.8 | 12.7 |
| Pitch a = l/n | 10.2 | 13.5 |
| Flat Zone l | 762 | 1016 |
| No. of Wafers n | 75 | 75 |
| Wafer φ ($\phi_w$) | 200 | 200 |

TABLE 5

| Family 300 mm | Min., mm | Max., mm | Min., mm | Max., mm |
| --- | --- | --- | --- | --- |
| Slot Width w | 5.1 | 19.1 | 5.1 | 19.1 |
| Radial Clearance d | 1.5 | 6.4 | 1.5 | 6.4 |
| Tube Int. φ $\phi_{10} = \phi_w + 2d$ | 302.8 | 312.7 | 302.8 | 312.7 |
| Band Height b = a − c | 59.7 | 93.1 | 27.9 | 40.2 |
| Band Spacing c | 3.8 | 12.7 | 3.8 | 12.7 |
| Pitch a = l/n | 63.5 | 105.8 | 31.8 | 52.9 |
| Flat Zone l | 762 | 1270 | 762 | 1270 |

TABLE 5-continued

| Family 300 mm | Min., mm | Max., mm | Min., mm | Max., mm |
| --- | --- | --- | --- | --- |
| No. of Wafers n | 12 | 12 | 24 | 24 |
| Wafer φ ($\phi_w$) | 300 | 300 | 300 | 300 |

TABLE 6

| Family 300 mm | Min., mm | Max., mm | Min., mm | Max., mm |
| --- | --- | --- | --- | --- |
| Slot Width w | 5.1 | 19.1 | 5.1 | 19.1 |
| Radial Clearance d | 1.5 | 6.4 | 1.5 | 6.4 |
| Tube Int. φ $\phi_{10} = \phi_w + 2d$ | 302.8 | 312.7 | 302.8 | 312.7 |
| Band Height b = a − c | 17.3 | 22.6 | 12.1 | 13.8 |
| Band Spacing c | 3.8 | 12.7 | 3.8 | 12.7 |
| Pitch a = l/n | 21.2 | 35.3 | 15.9 | 26.5 |
| Flat Zone l | 762 | 1270 | 762 | 1270 |
| No. of Wafers n | 36 | 36 | 48 | 48 |
| Wafer φ ($\phi_w$) | 300 | 300 | 300 | 300 |

The preferred value for NumberBands is from about 12 to about 100, provided that Height$_{Band}$ is at least greater than or equal to the wafer thickness. Each band has an inner surface, and each band and wafer support means defines a wafer occupancy zone corresponding to the volume to be occupied by a wafer for which it is sized, the radial clearance between the outer edge of the wafer occupancy zone and the inner surface of the respective band preferably being within the range of from about 1.5 to 6.3 mm.

Optimally, the value for NumberBands is selected for each wafer size. When the volume to be occupied by a wafer (the wafer occupancy zone) is about 150 mm, the NumberBands is optimally from about 25 to 100. When the volume to be occupied by a wafer is about 200 mm, the NumberBands is optimally from about 25 to 75. When the volume to be occupied by a wafer is about 300 mm, the NumberBands is optimally from about 12 to 48.

Figure 5:
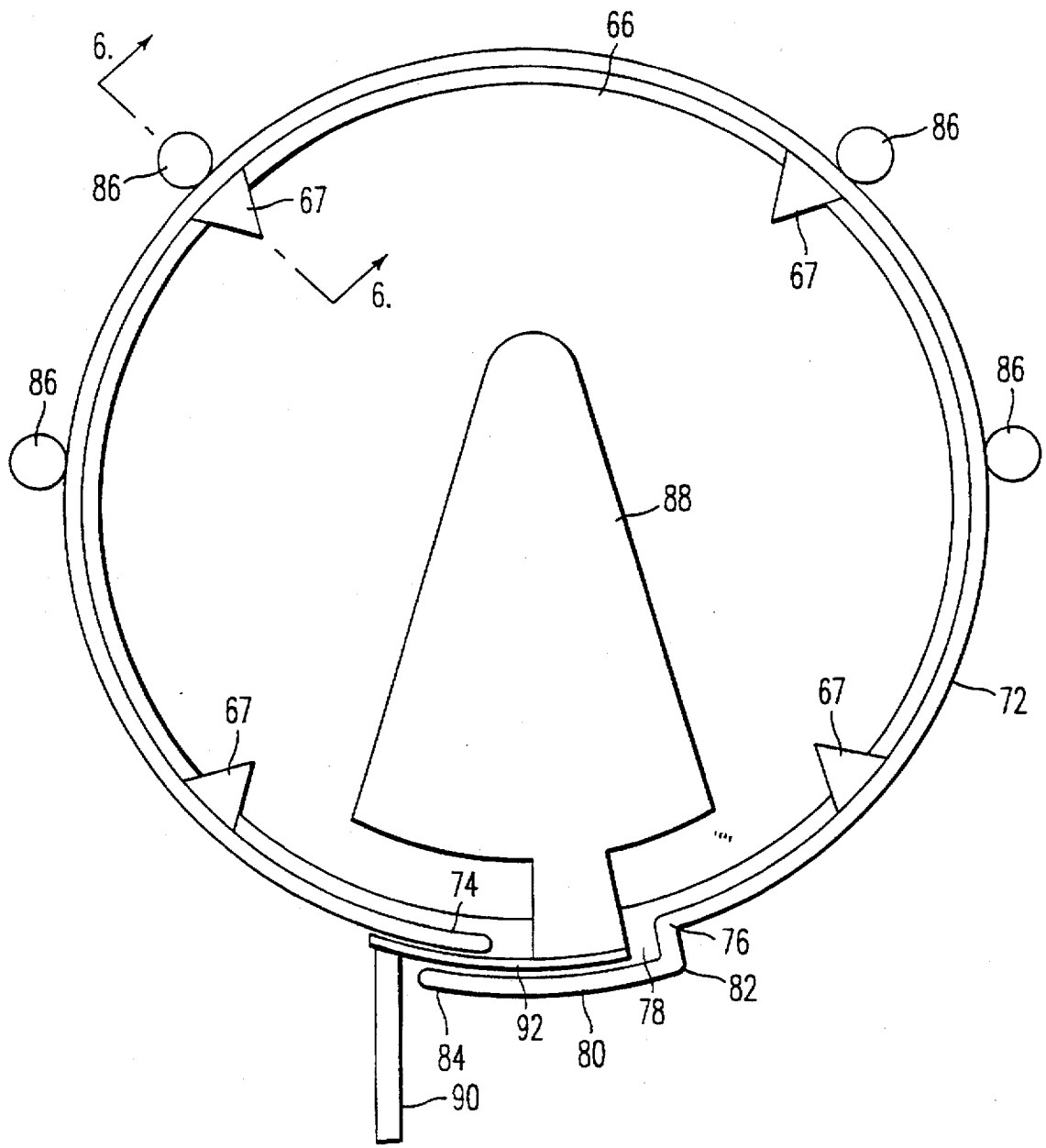
FIG. 5 is a bottom view of a wafer as it is being positioned in the wafer stack by a wafer transport effector.
Figure 6:
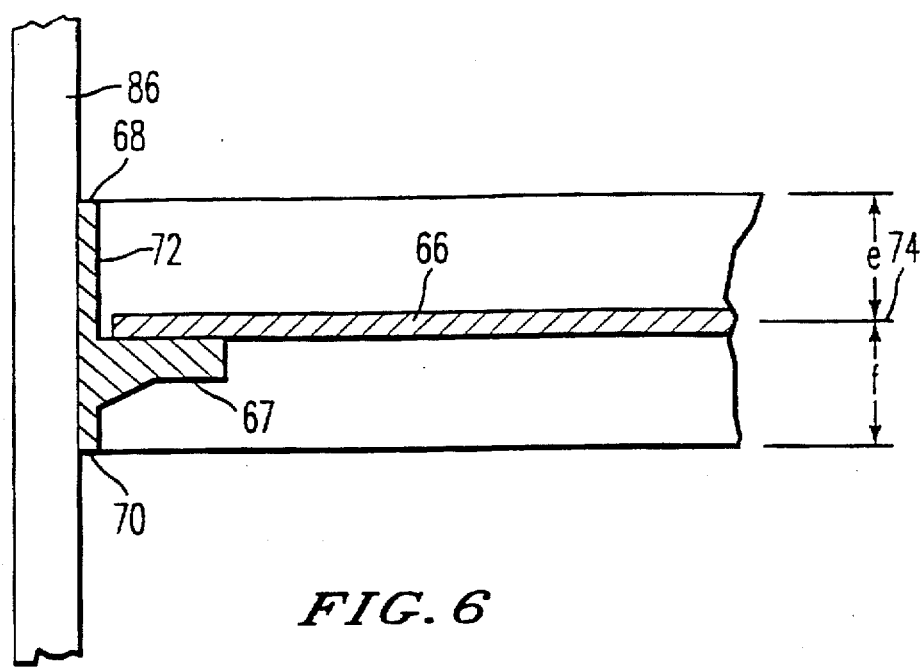
FIG. 6 a fragmentary, enlarged cross-sectional view of a portion of a wafer stack taken along the line 6—6 in FIG. 5, showing the positional relationship between the wafers supported in the annular heat shield and the heat shield.

FIG. 5 is a bottom view of a wafer as it is being positioned in the wafer stack by a wafer transport effector, and FIG. 6 is a fragmentary, enlarged cross-sectional view, taken along the line 6—6 in FIG. 5 of a portion of a wafer stack showing the positional relationship between the wafers supported in the annular heat shield and the heat shield.

Referring to FIG. 6, the wafer 66 is optimally centered in a position on support 67 which is approximately equidistant from the upper edge 68 and lower edge 70 of the heat shield 72, that is, the distance "e" and "f" from a plane 74 positioned in the center of the wafer, perpendicular to the wafer axis, and planes parallel thereto in which the upper edge 68 and lower edge 72 are preferably substantially the same. This will provide even heat exposure to the top and bottom surfaces of the wafer.

Referring to FIG. 5, each annular heat shield 72 is a partial circle with opposed ends 74 and 76 defining a gap or wafer transfer slot 78 having a width "w" through which a wafer transfer device is passed in lowering a wafer into position on support projections 67. The optimum sizes of the gap 78 are shown in above Tables I, II, III, IV, V and VI. Optimally, the gap 78 has a width, "w", of from 5 to 20 mm.

An optional wafer transfer slot shield segment 80 can be positioned laterally offset from the heat shield 72. Preferably, one end 82 of the shield segment 80 is attached to an end 76 of the heat shield, and the other end 84 of the shield segment 80 extends beyond the other end 74, overlapping the end 74. The heat shields 72 are attached to support rods 86.

When wafers are loaded or unloaded from the wafer boat, each wafer is positioned in a respective heat shield section or removed therefrom. Wafers are loaded into the heat shield section before processing by lowering a wafer transfer support or effector 88 with a wafer 66 supported thereon downward through the respective shield 72, depositing the wafer on the upper surface of the respective projections 67. The effector 88 then continues to move downward to below the heat shield, from which position it is withdrawn. Conversely, to remove a wafer from its position in a heat shield, the wafer support effector 88 is introduced below the heat shield and raised to elevate the wafer from its position to a position above the heat shield. The wafer support, bearing the wafer, is then withdrawn from the boat.

The wafer support 88 is connected to an actuator 90 by means of a connector arm 92 shaped and sized to pass downward through the gap spacing 78 and the offset space between the shield segment 80 and the heat shield 72. In this movement through the heat shield, the connector 92 passes between the surfaces of the heat shield ends and offset shield segment to deposit or remove the wafer from the supports 67. The dimensions of the gap 78 and connector 92 are not critical so long as they are mutually sized to permit free upward and downward passage of the connector 92 through the gap spacing.

FIGS. 7–10 are consecutive schematic views of the movements of the wafer transport components with respect to the heat shield 72 during the deposit of a wafer 66 therein.

Figure 7:
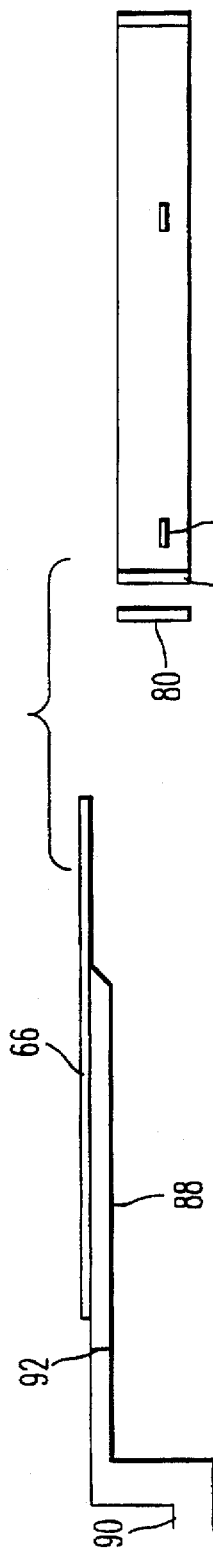
FIG. 7 is a schematic view of a wafer transport effector supporting a wafer as it approaches a annular heat shield in which it is to be positioned.
Figure 8:
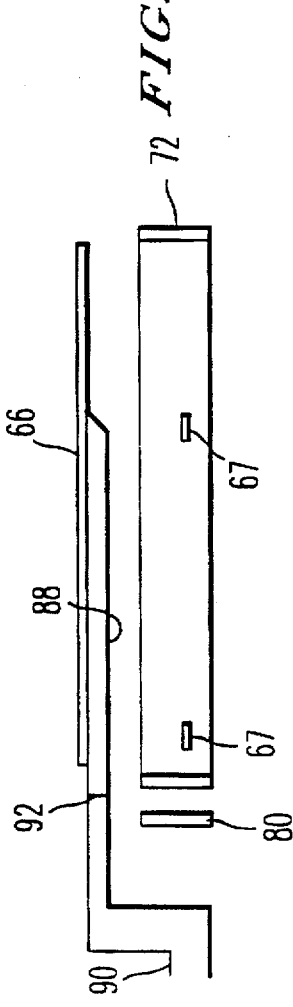
FIG. 8 is a schematic view of wafer transport effector supporting a wafer as it approaches a annular heat shield of FIG. 7, elevated above the heat shield.
Figure 9:
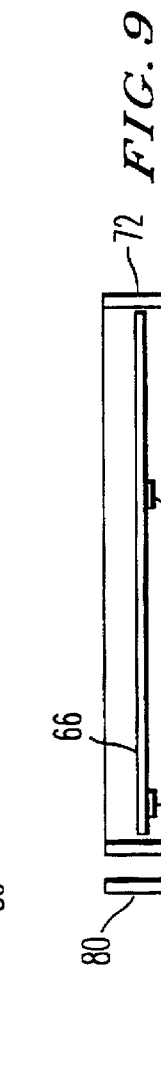
FIG. 9 is a schematic view of wafer transport effector of FIG. 8 below the wafer, after it has deposited the wafer in the annular heat shield.
Figure 10:
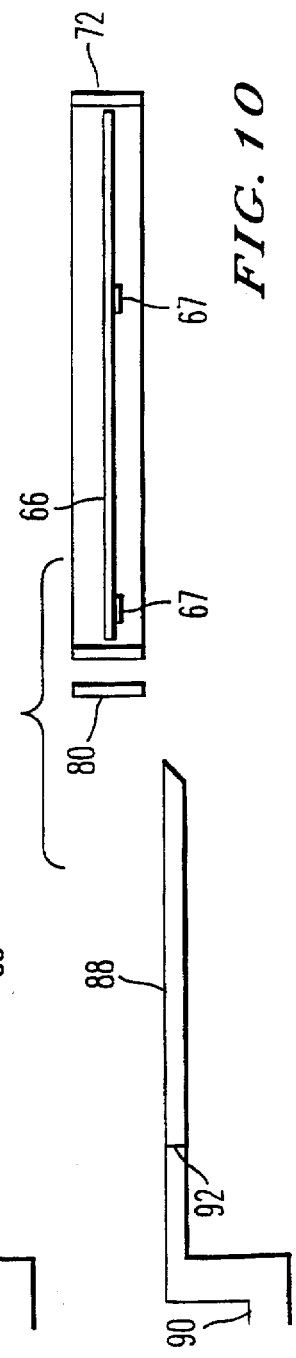
FIG. 10 is a schematic view of the wafer transport effector of FIG. 9 as it withdraws from the heat shield, after depositing the wafer therein.

In FIG. 7 wafer transport effector 88 supporting a wafer 66 approaches a annular heat shield 72 in which the wafer 66 is to be positioned. FIG. 8 shows the position with the wafer 66 elevated directly above the heat shield 72. FIG. 9 shows the wafer transport effector 88 below the wafer 66, after it has deposited the wafer in the annular heat shield 72. FIG. 10 shows the wafer transport effector 88 as it withdraws from the heat shield 72, after depositing the wafer 66 therein. For removal of a wafer from the heat shield segment, the sequence shown by these schematic views are reversed.

Figure 11:
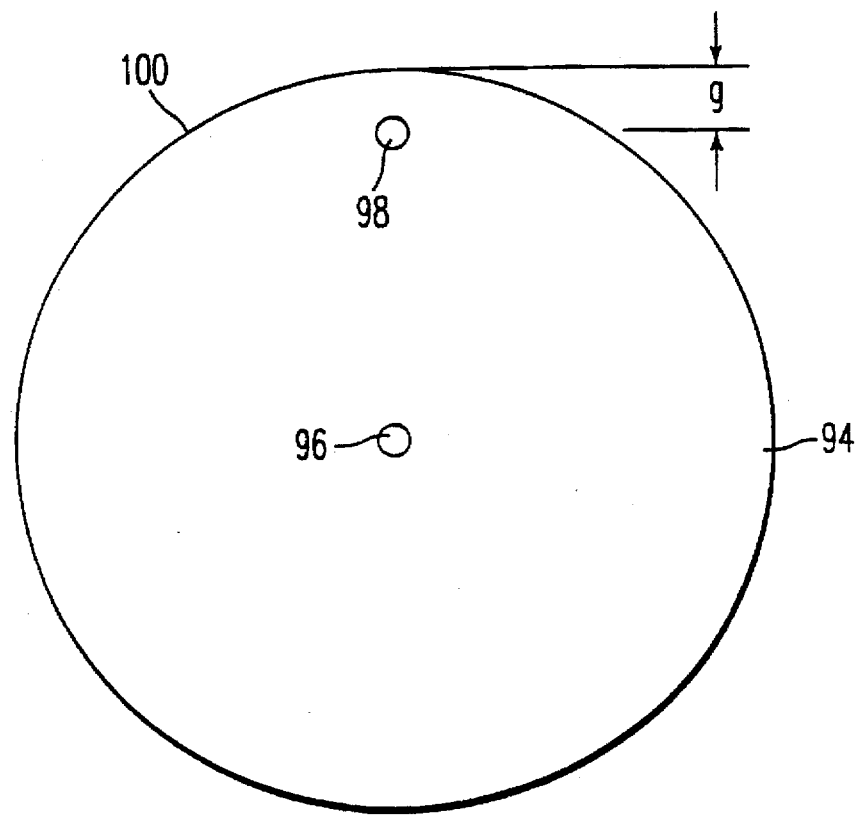
FIG. 11 is a schematic view of a test wafer showing the position of thermocouples on the center and outer periphery of a wafer surface.

FIG. 11 is a schematic view of a test wafer 94 showing the position of thermocouples 96 and 98 on the respective center and outer periphery of a wafer surface. The thermocouples 96, 98 are embedded into the wafer surface. Thermocouple 96 is attached to a test wafer 94 at the axial center of the wafer, and a second thermocouple 98 is attached at a distance "g" of 0.6 mm from the outer edge 100 of the test wafer 94.

Figure 12:
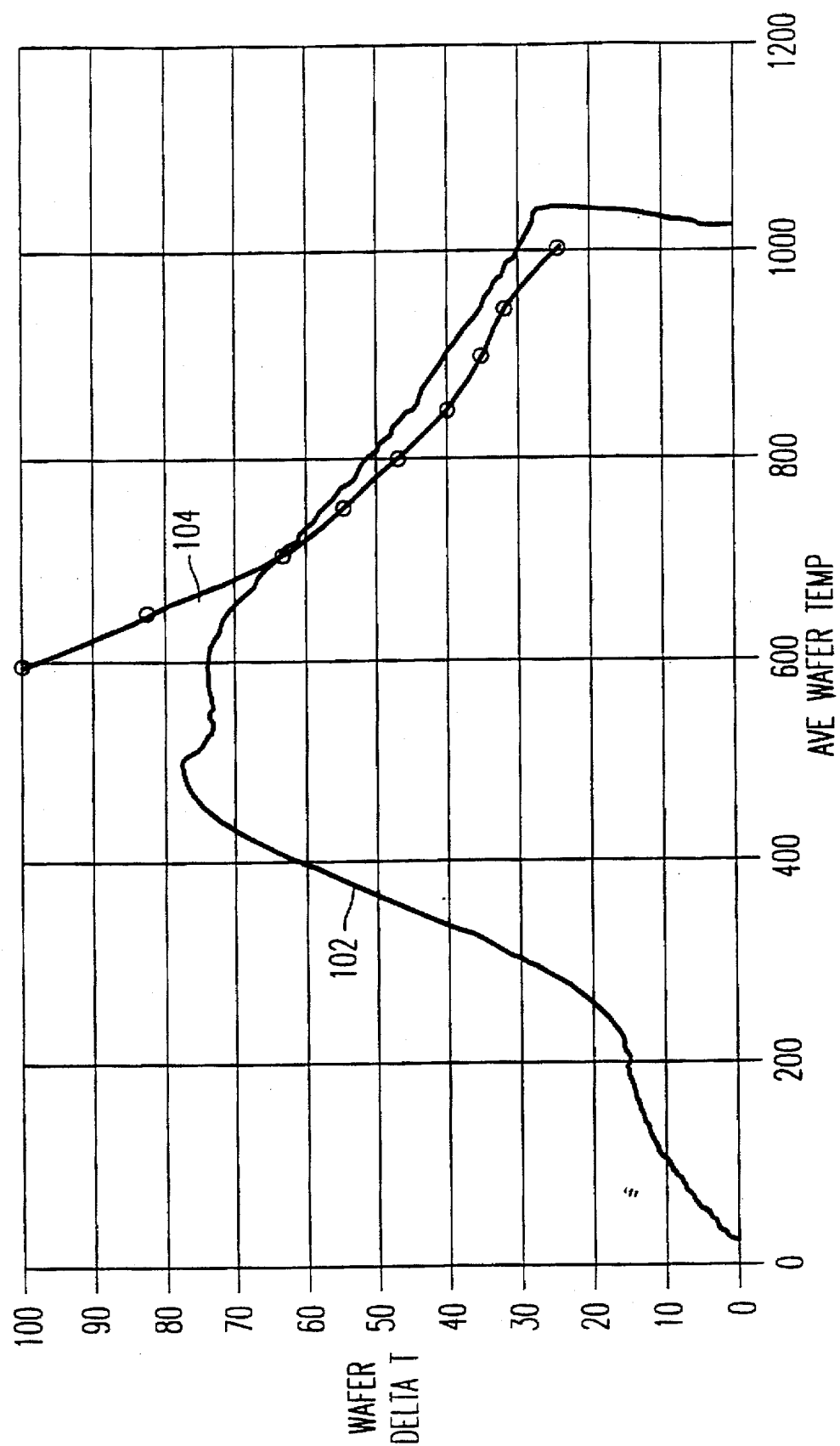
FIG. 12 is a graph view of the temperature differences detected by the thermocouples position as shown in FIG. 11 during rapid heating in a conventional wafer stack.

FIG. 12 is a graph view of the temperature differences detected by thermocouples positioned as shown in FIG. 11 during rapid heating in a conventional wafer stack. The wafer stack was exposed to a fast ramp element at 75° C./min from 25° C. to 1000° C. FIG. 12 shows a plot 102 of the temperature differences between the measurements by the thermocouples 96 and 98 is shown as a Delta T versus the average wafer temperature over the full thermal cycle. This data was taken with 25 wafers spaced above and 25 wafers spaced below the test wafer in a standard wafer boat, with a distance of 2.54 mm between the wafer immediately above and immediately below the test wafer. The temperature difference plot 104 represents the maximum acceptable stress limit to which a wafer can be exposed without significant structural damage. As can be seen, the temperature profile 102 experienced with the conventional wafer boat construction exceeded the stress limits above about 700° C.

Figure 13:
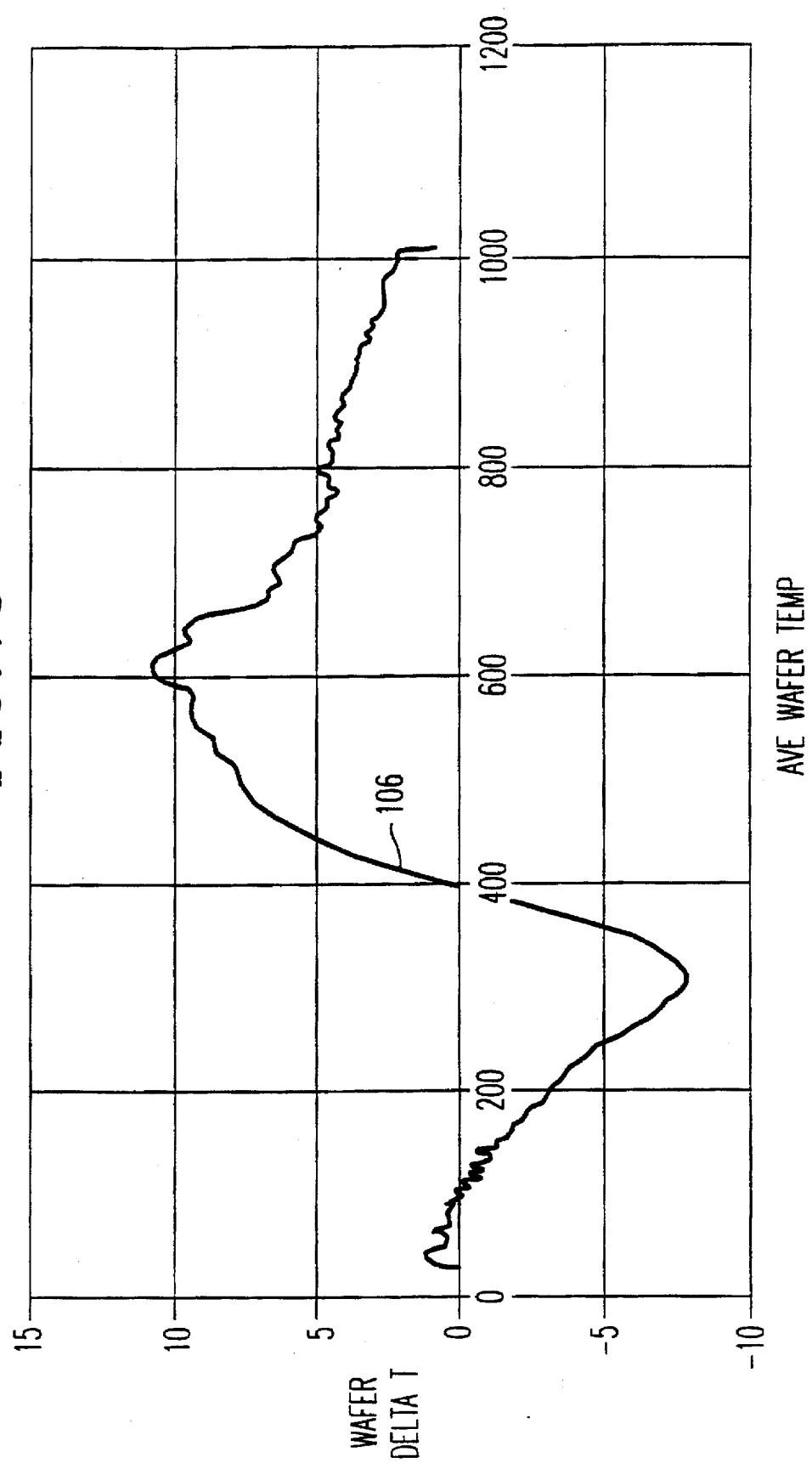
FIG. 13 is a graph view of the temperature differences detected by the thermocouples position as shown in FIG. 11 during rapid heating in a wafer stack according to this invention.

FIG. 13 is a graph view of the temperature differences detected by the thermocouples position as shown in FIG. 11 during rapid heating in a wafer stack with heat shields according to this invention. The wafer stack was exposed to a fast ramp element at 75° C./min from 25° C. to 1000° C. The test wafer 94 was positioned with 25 wafers above and 25 wafers below, the test wafer being positioned in a annular shield according to this invention with a height of 2.54 mm. The distance between the test wafer and wafers immediately above and below it were 2.54 mm. The temperature differences shown in plot 106 detected by the thermocouples at the center and edge of the test wafer 94 and experienced by the test wafer were far below the maximum acceptable stress limit plot (FIG. 12 values).

It will be readily apparent to a person skilled in the art that numerous modifications and variations of the present invention are possible in light of the above teachings. It is therefore to be understood that within the scope of the appended claims, the invention may be practiced otherwise than as specifically described herein.

The invention claimed is:

1. A thermal treatment boat comprising a plurality of annular, coaxial, spaced apart bands having substantially the same inner diameters, each band having an upper edge surface and a lower edge surface, the lower edge surface of the upper band of each set of adjacent bands being opposed to the upper edge surface of the lower band of each set and being spaced therefrom by a band spacing distance of from about 3.8 to 12.7 mm, each of the bands having a height, $Height_{Band}$, in mm according to the equation:

$$Height_{Band} = \frac{ColumnHeight - \Sigma BandSpacing}{NumberBands}$$

wherein $Height_{Band}$ is always ≥ wafer thickness;

ColumnHeight is the total height of the treatment boat in mm;

BandSpacing is the band spacing distance between adjacent bands in mm; and wherein each band includes wafer support means for supporting a wafer therein, the wafer being supported substantially centered between the upper edge surface and the lower edge surface of the band.

2. A thermal treatment boat according to claim 1 wherein NumberBands is from about 12 to about 100, provided that $Height_{Band}$ is at least greater than the wafer thickness.

3. A thermal treatment boat of claim 1 wherein the bands are supported in a unitary assembly by axially extending rods or plates to which the bands are attached.

4. A thermal treatment boat of claim 1 wherein the wafer support means includes at least three inwardly extending projections.

5. A thermal treatment boat of claim 1 wherein each band has an inner surface, and each band and wafer support means defines a wafer occupancy zone corresponding to the volume to be occupied by a wafer for which it is sized, the radial clearance between the outer edge of the wafer occupancy zone and the inner surface of the respective band being within the range of from about 1.5 to 6.3 mm.

6. A thermal treatment boat of claim 1 wherein each band and wafer support means defines a wafer occupancy zone corresponding to the volume to be occupied by a wafer for which it is sized, the outer diameter of the wafer occupancy zone is about 150 mm, and the NumberBands is from about 25 to 100.

7. A thermal treatment boat of claim 1 wherein each band and wafer support means defines a wafer occupancy zone corresponding to the volume to be occupied by a wafer for which it is sized, the outer diameter of the wafer occupancy zone is about 200 mm, and the number bands is from about 25 to 75.

8. A thermal treatment boat of claim 1 wherein each band and wafer support means defines a wafer occupancy zone corresponding to the volume to be occupied by a wafer for which it is sized, the outer diameter of the wafer occupancy zone is about 300 mm, and the number bands is from about 12 to 48.

9. A thermal treatment boat of claim 1 wherein each band is an incomplete circle, the opposed ends thereof defining a slot having a width of from 5 to 20 mm.

10. A thermal treatment boat of claim 9 including a slot shield element laterally displaced from said slot and overlapping the slot, whereby to reduce radiant heat impinging on the slot.

11. A thermal treatment boat of claim 1 having components made of metal, crystal, ceramic, graphite or a composite thereof.

12. A thermal treatment boat of claim 11 having components made of quartz, polysilicon or silicon carbide.

13. A thermal treatment boat of claim 1 wherein in each boat, the height of each band and the band spacing between adjacent bands are substantially the same.

14. A process for heat treating multiple wafers positioned in a mutually parallel orientation in a heating zone surrounded by a heater emitting radiant heat, the improvement comprising shielding the outer portions of each wafer from radiant heat emitted by the heater with an annular heat band positioned between the outer edge of each wafer and the heater, each annular heat band being one of a plurality of coaxial, spaced apart heat bands having substantially the same inner diameters, each band having an upper edge surface and a lower edge surface, the lower edge surface of the upper band of each set of adjacent bands being opposed to the upper edge surface of the lower band of each set and being spaced therefrom by a band spacing distance of from about 3.8 to 12.7 mm, each of the bands having a height, $Height_{Band}$, in mm according to the equation:

$$Height_{Band} = \frac{ColumnHeight - \Sigma BandSpacing}{NumberBands}$$

wherein $Height_{Band}$ is always $\geq$ wafer thickness;

ColumnHeight is the total height of the treatment boat in mm;

BandSpacing is the band spacing distance between adjacent bands in mm; and wherein each band includes wafer support means for supporting a wafer therein, the wafer being supported substantially centered between the upper edge surface and the lower edge surface of the band.

15. A process of claim 14 wherein the distance between the edge of each wafer and the band by which it is shielded is from 1.5 to 6.3 mm.

16. A process of claim 14 wherein the heat provided by the heater is sufficient to raise the temperature of the wafers from 21° C. up to 1100° C. at a rate of from 50° C./min to 100° C./min without causing mechanical damage due to induced stresses in the wafers.

* * * * *